United States Patent
Sinclair et al.

(10) Patent No.: US 11,665,810 B2
(45) Date of Patent: May 30, 2023

(54) MODULAR LINEAR ACCELERATOR ASSEMBLY

(71) Applicant: Applied Materials, Inc., Santa Clara, CA (US)

(72) Inventors: Frank Sinclair, Boston, MA (US); Paul J. Murphy, Reading, MA (US); Michael Honan, Peabody, MA (US); Charles T. Carlson, Cedar Park, TX (US)

(73) Assignee: APPLIED Materials, Inc., Santa Clara, CA (US)

( * ) Notice: Subject to any disclaimer, the term of this patent is extended or adjusted under 35 U.S.C. 154(b) by 259 days.

(21) Appl. No.: 17/112,576

(22) Filed: Dec. 4, 2020

(65) Prior Publication Data

US 2022/0183137 A1    Jun. 9, 2022

(51) Int. Cl.
*H05H 7/18* (2006.01)
*H01J 37/317* (2006.01)

(52) U.S. Cl.
CPC ........... *H05H 7/18* (2013.01); *H01J 37/3171* (2013.01)

(58) Field of Classification Search
None
See application file for complete search history.

(56) References Cited

U.S. PATENT DOCUMENTS

| | | | |
|---|---|---|---|
| 4,560,905 A | 12/1985 | Maschke | |
| 4,596,946 A | 6/1986 | Pottier | |
| 4,712,042 A | 12/1987 | Hamm | |
| 6,239,541 B1 | 5/2001 | Fujisawa | |
| 6,291,828 B1 * | 9/2001 | Saadatmand | H01J 37/3171 250/492.21 |
| 2002/0084427 A1 * | 7/2002 | Saadatmand | H05H 9/00 250/492.1 |
| 2017/0223815 A1 | 8/2017 | Yamamoto et al. | |

FOREIGN PATENT DOCUMENTS

| | | |
|---|---|---|
| JP | 2835951 B2 | 12/1998 |
| TW | 441226 B | 6/2001 |
| TW | 523796 B | 3/2003 |
| TW | I474762 B | 2/2015 |

OTHER PUBLICATIONS

International Search Report and Written Opinion dated Feb. 23, 2022, for the International Patent Application No. PCT/US2021/057414, filed on Oct. 29, 2021, 9 pages.

* cited by examiner

*Primary Examiner* — Dedei K Hammond
(74) *Attorney, Agent, or Firm* — KDB Firm PLLC (57) ABSTRACT

Embodiments herein are directed to a linear accelerator assembly for an ion implanter. In some embodiments, the linear accelerator assembly may include a central support within a chamber, and a plurality of modules coupled to the central support, at least one module of the plurality of modules including an electrode having an aperture for receiving and delivering an ion beam along a beamline axis.

14 Claims, 8 Drawing Sheets

MODULAR LINEAR ACCELERATOR ASSEMBLY

FIELD OF THE DISCLOSURE

The present disclosure relates generally to high-energy ion implanters and, more particularly, to modular linear accelerator assemblies of ion implanters.

BACKGROUND OF THE DISCLOSURE

Ion implantation is a process of introducing dopants or impurities into a substrate via bombardment. Ion implantation systems include an ion source and a series of beam-line components. The ion source may comprise a chamber where ions are generated. The ion source may also include a power source and an extraction electrode assembly disposed near the chamber. The beam-line components may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or an ion beam having particular species, shape, energy, and/or other qualities. The ion beam passes through the beam-line components and may be directed toward a substrate mounted on a platen or clamp.

Some ion implantation systems include a linear accelerator (LINAC) in which a series of electrodes are arranged as tubes to conduct and accelerate the ion beam to increasingly higher energies. LINACs may be driven by a signal using a resonator circuit including a coil and a capacitor. Some current LINACs are built on a fixed platform, which reduces the ability to customize the LINAC based on customer and/or product needs.

What is therefore needed is a LINAC that enables modular design and integration.

SUMMARY OF THE DISCLOSURE

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one approach, a linear accelerator assembly may include a central support within a chamber, and a plurality of modules coupled to the central support, at least one module of the plurality of modules including an electrode having an aperture for receiving and delivering an ion beam along a beamline axis.

In another approach, an ion implanter may include an ion source operable to generate and extract an ion beam, and a linear accelerator assembly operable to receive the ion beam, wherein the linear accelerator assembly may include a central support extending within an interior of a vacuum chamber, and a plurality of modules coupled to the central support, at least one module of the plurality of modules including an electrode having an aperture for receiving and delivering an ion beam along a beamline axis.

In yet another approach, a linear accelerator assembly of an ion implanter may include a central support within a chamber, the central support extending parallel to a beamline axis. The linear accelerator assembly may further include a plurality of quadrupole modules and a plurality of resonator modules each coupled to the central support, wherein one or more resonator modules of the plurality of resonator modules includes an electrode having an aperture for receiving and delivering an ion beam along the beamline axis.

BRIEF DESCRIPTION OF THE DRAWINGS

The accompanying drawings illustrate exemplary approaches of the disclosure, including the practical application of the principles thereof, as follows.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Ion implanters and linear accelerators in accordance with the present disclosure will now be described more fully hereinafter with reference to the accompanying drawings, where embodiments of the ion implanters and linear accelerators are shown. The ion implanters and linear accelerators may be embodied in many different forms and are not to be construed as being limited to the embodiments set forth herein. Instead, these embodiments are provided so this disclosure will be thorough and complete, and will fully convey the scope of the disclosure to those skilled in the art.

Provided herein are approaches for an improved high-energy ion implantation system, which may also be referred to herein as an "ion implanter" for the sake of brevity. Various embodiments provide novel configurations for generating high energy ions, where the final ion energy delivered to a substrate may be 1 MeV or greater. One aspect of embodiments of the present disclosure is a novel LINAC assembly, providing various advantages over known beamline architecture.

In exemplary embodiments, a linear accelerator assembly includes a precision backbone, or central support, upon which modular sub-assemblies may be positioned. The central support provides a common datum reference for all modules, thus locking all degrees of freedom except along the beam axis. Embodiments herein permit user modification at almost any point of the system build to meet custom configuration requirements, while also maintaining system commonality and a flexible architecture.

Furthermore, the central support may provide a tolerancing structure that ensures high precision of the integrated modules. For example, the central support may include two or more datum surfaces each serving as a precision surface to define a precision axis along the beam axis. Modules may use the datum surfaces, and an offset to the merged datums, to precisely align to the beam axis.

Figure 1:
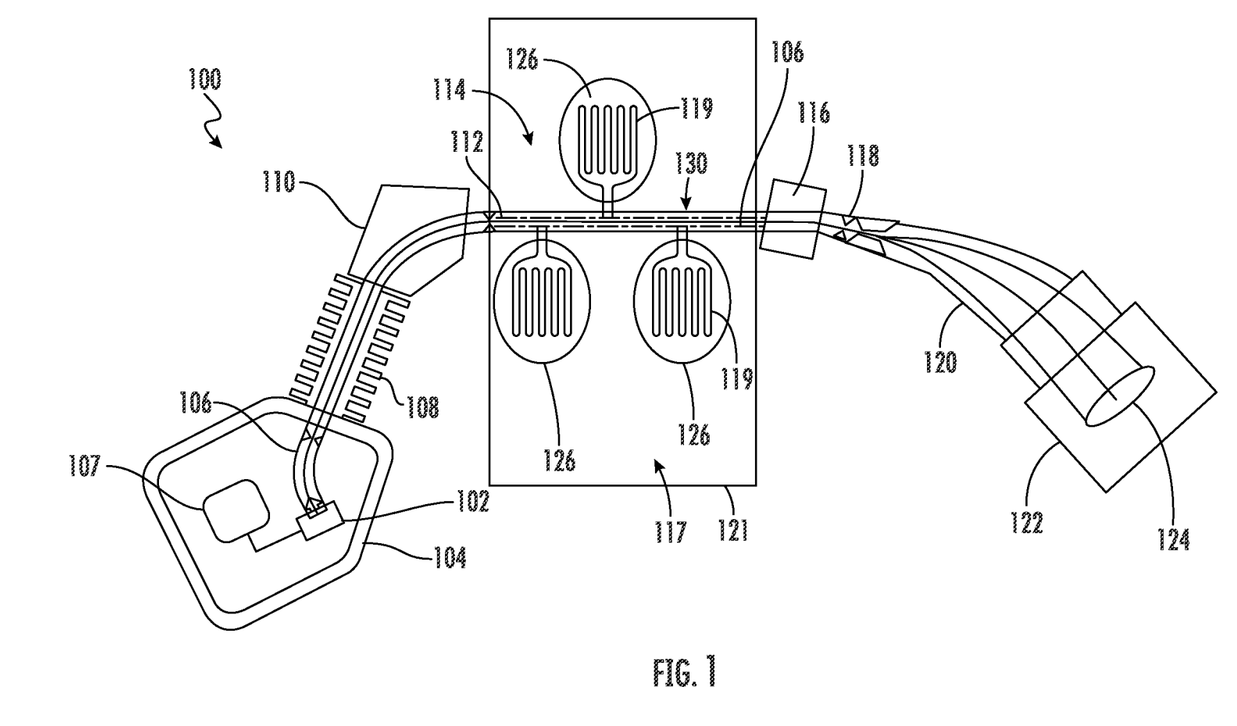
FIG. 1 is a schematic view illustrating an ion implanter in accordance with embodiments of the present disclosure.

Referring now to FIG. 1, an exemplary ion implanter (hereinafter "implanter") 100 is shown in block form. The implanter 100 may represent a beamline ion implanter, with some elements not shown for clarity of explanation. The implanter 100 may include an ion source 102 and a gas box 107 disposed in a terminal 104. The ion source 102 may include an extraction system including extraction components and filters (not shown) to generate an ion beam 106 at a first energy. Although non-limiting, the first ion energy may range from 5 keV to 100 keV. The implanter 100 may further include a DC accelerator column 108, disposed downstream of the ion source 102. The DC accelerator column 108 is operable to accelerate the ion beam 106 to a second ion energy, where the second ion energy is greater than the first ion energy.

The implanter 100 may further include an analyzer 110, operable to analyze the accelerated ion beam 106, for example, by changing the trajectory of the ion beam 106. The implanter 100 may also include a buncher 112 and a linear accelerator assembly 114 within a chamber 117 (e.g., vacuum chamber) of a housing 121, the linear accelerator assembly 114 disposed downstream of the DC accelerator column 108. During use, the linear accelerator assembly 114 is operable to accelerate the ion beam 106 to a third energy, greater than the second energy.

The linear accelerator assembly 114 may include a plurality of accelerator stages 126 arranged along a central support 130. Each of the plurality of accelerator stages 126 may include one or more coils 119, as will be further described herein. In some embodiments, the accelerator stages 126 of the linear accelerator assembly 114 may be double gap accelerator stages, while in other embodiments the accelerator stages 126 may be triple gap accelerator stages. In particular embodiments, the linear accelerator assembly 114 may include at least three triple gap accelerator stages. Embodiments are not limited in this context, however. In various embodiments, the implanter 100 may include additional components, such as filter magnet 116, a scanner 118, and a collimator 120, which together deliver high-energy ion beam 106 to an end station 122 for processing a substrate 124.

Figure 2:
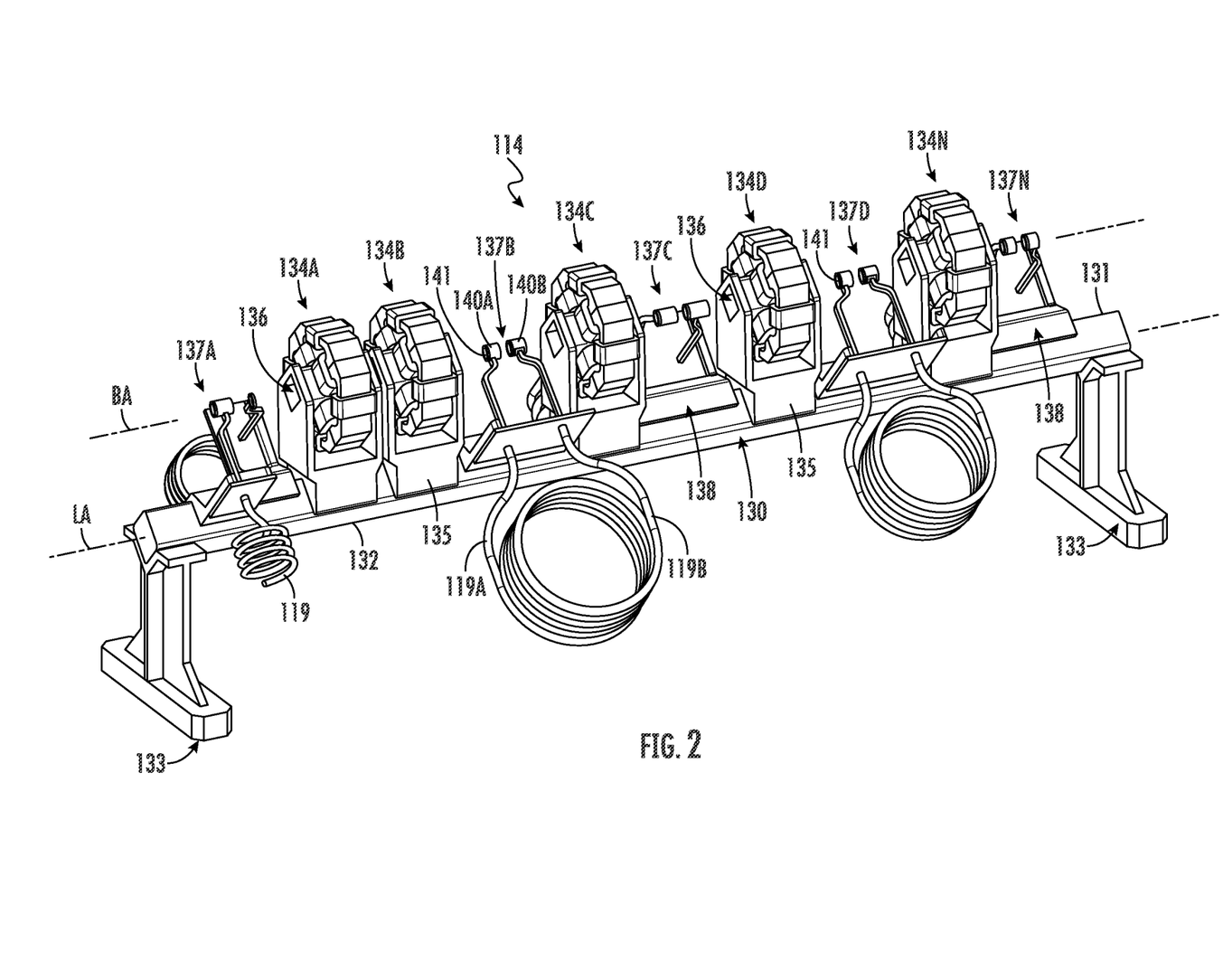
FIG. 2 is a perspective view of a modular linear accelerator assembly in accordance with embodiments of the present disclosure.

FIG. 2 demonstrates an example linear accelerator assembly 114 according to embodiments of the present disclosure. As shown, the linear accelerator assembly 114 may include the central support 130 having a lengthwise axis 'LA' extending parallel to a beamline axis 'BA'. The central support 130 may take on a rectangular or cuboid shape with a square cross-section. Embodiments herein are not limited in this context, however. As shown, the central support 130 may include an upper edge or apex 131 pointing towards the beamline axis and a lower edge 132 extending into a valley defined by a set of support pedestals 133. The set of support pedestals 133 may be positioned at opposite ends of the central support 130. In some embodiments, both the central support 130 and the set of pedestals are constructed from one or more insulative materials.

The linear accelerator assembly 114 may include a plurality of modules attached thereto. Although not limited to any particular type, modules of the present disclosure may include any combination of resonator modules, quadrupole focusing or steering systems, beam monitors, etc. The modules can be designed as independent units integrated to a variety of positions, thus meeting processing needs.

In the present embodiment, a plurality of quadrupole modules 134A-134N may be detachably coupled to the central support 130. Each of the quadrupole modules 134A-134N may include a quad mounting block 135 directly coupled to a surface of the central support 130. As will be described in greater detail herein, the quad mounting block 135 may wrap around or straddle the apex 131 of the central support 130. Each of the quadrupole modules 134A-134N may further include an opening 136 to receive an ion beam (not shown) traveling along the beamline axis.

The linear accelerator assembly 114 may further include a plurality of resonator modules 137A-137N detachably coupled to the central support 130. As shown, each of the resonator modules 137A-137N may include a resonator mounting block 138 directly coupled to a surface of the central support 130. The resonator mounting blocks 138 may receive one or more coils 119. In some embodiments, coil ends 140A, 140B of respective first and second coil sections 119A, 119B may include an aperture or opening 141 aligned along the beamline axis for passage of the ion beam therethrough.

As will be described in greater detail herein, the resonator mounting block 138 wraps around or straddles the apex 131 of the central support 130. As shown, the plurality of resonator modules 137A-137N may be interspersed with the plurality of quadrupole modules 134A-134N. For example, quadrupole modules 134A, 134B may be positioned between resonator modules 137A, 137B. Meanwhile, only a single quadrupole module (134C) may be positioned between resonator modules 137B and 137C. Due to the interchangeability of the modules of the linear accelerator assembly 114, a wide variety of different configurations for the plurality of resonator modules 137A-137N and the plurality of quadrupole modules 134A-134N are possible, as desired.

Figure 3:
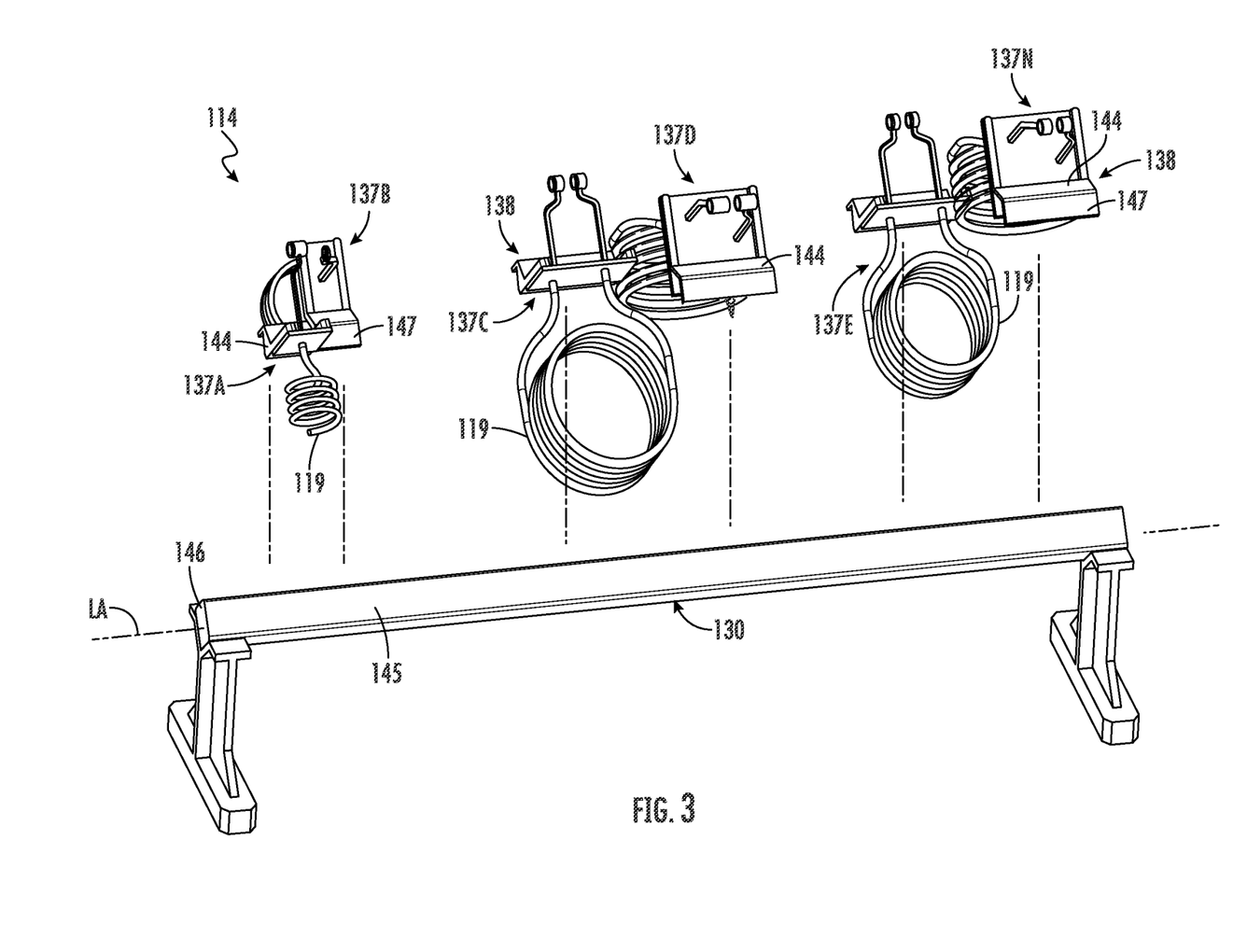
FIGS. 3-4 are perspective views of an approach for configuring the modular linear accelerator assembly in accordance with embodiments of the present disclosure.

As shown in FIG. 3, the plurality of resonator modules 137A-137N may be secured to the central support 130. Although not shown, the plurality of resonator modules 137A-137N may each be coupled to the central support 130 by one or more fasteners or attachment mechanisms. In some embodiments, the central support 130 may include a series of uniformly spaced docking or securement points configured to receive the fasteners.

As shown, the resonator mounting block 138 of each resonator module 137A-137N may include a main body 144 coupled to the central support 130. Depending on which side of the central support 130 each coil 119 extends, the main body 144 may be in direct physical contact with either a first side/surface 145 or a second side/surface 146 of the central support 130. A connector plate 147, which extends from the main body 144, may be in direct contact with an opposite of the first side 145 or the second side 146.

Figure 4:
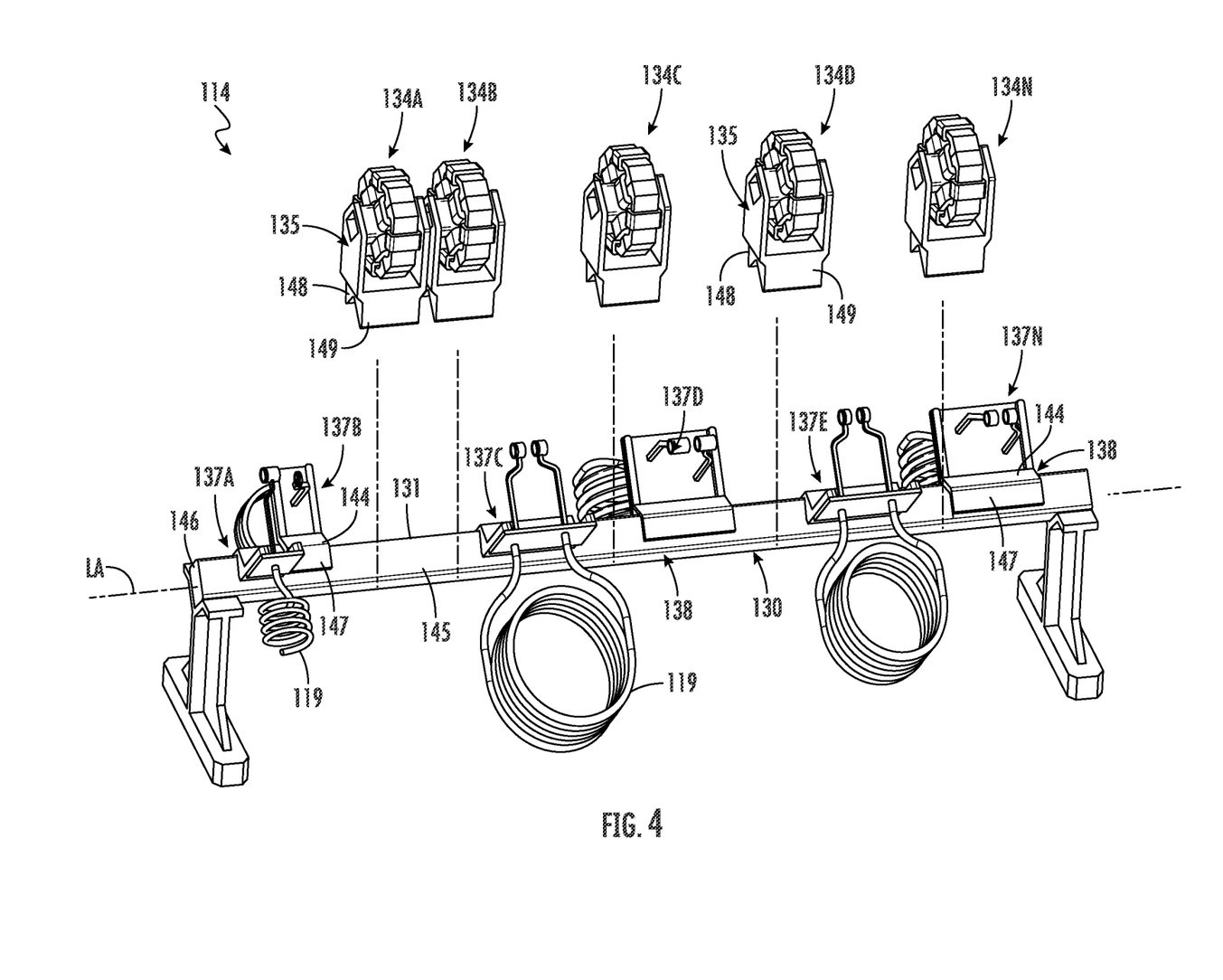

As shown in FIG. 4, the plurality of quadrupole modules 134A-134N may then be secured to the central support 130. Although not shown, the plurality of quadrupole modules 134A-134N may each be coupled to the central support 130 by one or more fasteners or attachment mechanisms. As stated above, the central support 130 may include a series of universal docking or securement points (not shown) configured to receive the fasteners of the quadrupole modules 134A-134N and/or the resonator modules 137A-137N.

In some embodiments, each quad mounting block 135 may include a first leg 148 and a second leg 149 configured to straddle the apex 131 of the central support 130. The first and second legs 148, 149 may be configured so an inner surface of the first leg 148 is in direct physical contact with the second side 146 of the central support 130 and an inner surface of the second leg 149 is in direct physical contact with the first side 145 of the central support 130.

Figure 5:
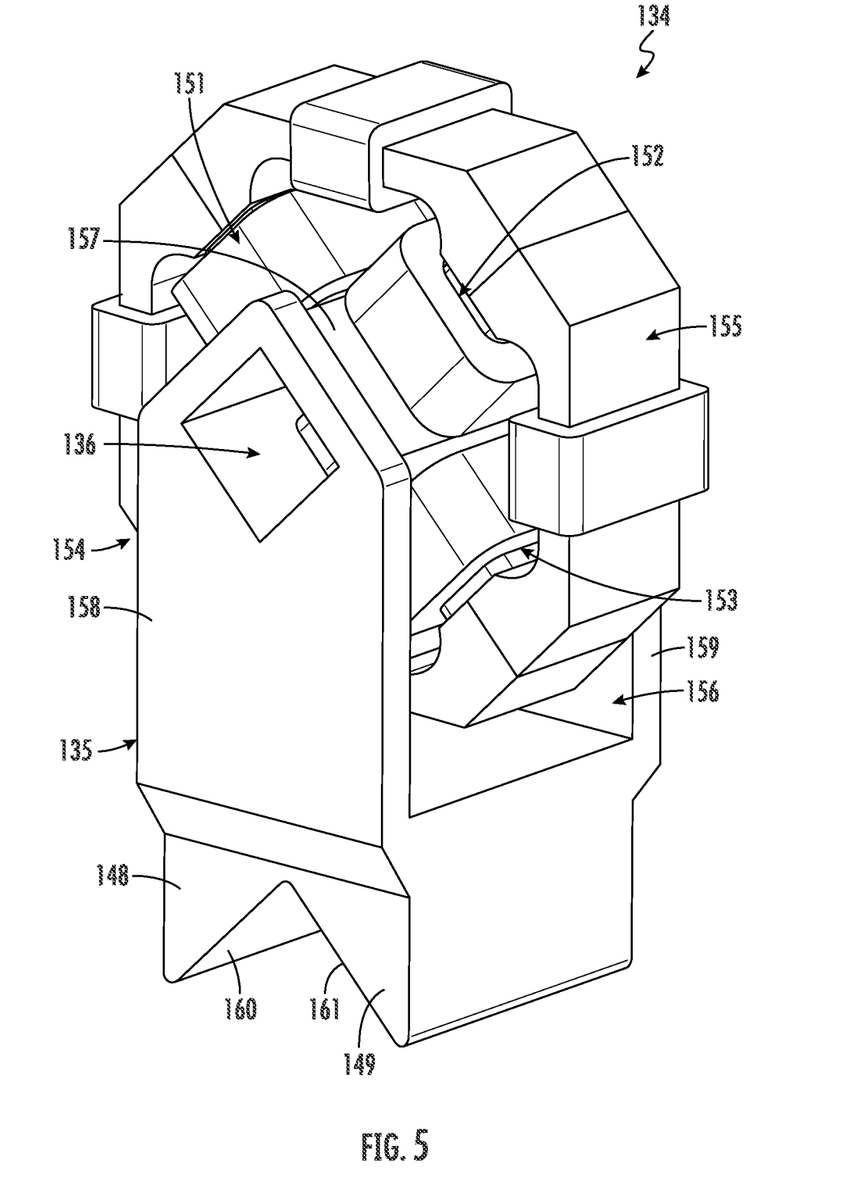
FIG. 5 is a perspective view of a quadrupole module of the modular linear accelerator assembly in accordance with embodiments of the present disclosure.

Referring to FIG. 5, an example quadrupole module 134 will be described in greater detail. As shown, quadrupole module 134 may be formed of four magnetic poles 151, 152, 153, and 154 coupled to a yoke 155 or other support structure. The magnetic poles 151-154 are effectively located within the chamber 117 (FIG. 1) of the linear accelerator assembly 114 so that pole faces can be located as close as necessary to the beam axis, which passes through opening 136 of the quad mounting block 135, to maximize field strength and to minimize stray magnetic fields.

In some embodiments, the quad mounting block 135 may include a central cavity 156 receiving the yoke 155 and magnetic poles 151-154. As shown, the magnetic poles 151-154 may be arranged about a channel wall 157, which extends between a first end wall 158 and a second end wall 159 of the quad mounting block 135. An interior of the channel wall 157 generally defines the opening 136. As previously discussed, the quad mounting block 135 includes the first leg 148 and the second leg 149. A plane defined by an inner surface 160 of the first leg 148 may extend perpendicular to a plane defined by an inner surface 161 of the second leg 149. Although not shown, the inner surfaces 160, 161 may include one or more attachment devices to enable releasable attachment with the central support 130 (FIG. 4).

Figure 6:
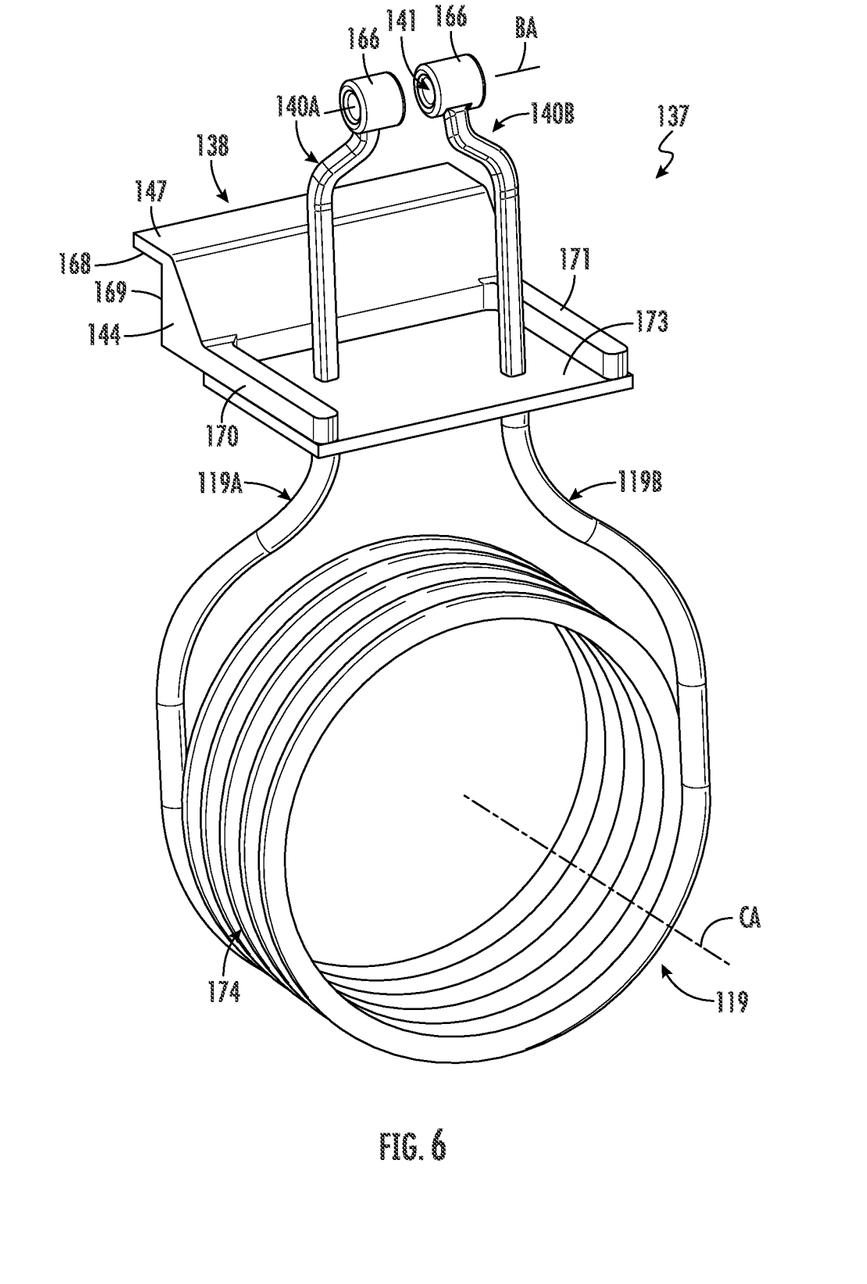
FIG. 6 is a perspective view of a resonator module of the modular linear accelerator assembly in accordance with embodiments of the present disclosure.

Referring to FIG. 6, an example resonator module 137 will be described in greater detail. As shown, the resonator module 137 may include the coil 119 having a first and second coil sections 119A, 119B. The resonator module 137 includes the resonator mounting block 138 coupleable with the central support 130 (FIG. 4). In some embodiments, coil ends 140A, 140B of respective first and second coil sections 119A, 119B may each include a conduit 166 defining the opening 141. As shown, the beamline axis 'BA' may extend centrally through each conduit 166.

As shown, the resonator mounting block 138 includes the main body 144 integrally formed with the connector plate 147. In some embodiments, an inner surface 168 of the connector plate 147 may be in direct contact with the first side 145 of the central support 130, while an inner surface 169 of the main body 144 may be direct contact with the second side 146 of the central support 130. A plane defined by the inner surface 168 may extend perpendicular to a plane defined by the inner surface 169. Although not shown, the inner surfaces 168, 169 may include one or more attachment devices to enable releasable attachment with the central support 130.

Extending from the main body 144 may be a first support arm 170 and a second support arm 171. Although non-limiting, the first and second support arms 170, 171 may extend parallel to one another. The first and second support arms 170, 171 may also extend parallel to the connector plate 147 in some embodiments. As shown, an insulator plate 173 extends between the first and second support arms 170, 171. The first and second coil sections 119A, 119B may extend through openings in the insulator plate 173. The insulator plate 173 acts as a mechanical support for the coil ends 140A, 140B of respective first and second coils 119A, 119B, while also insulating the coil 119 from ground.

As further shown, the coil 119 may include a central section 174 connected with the coil ends 140A and 140B, wherein the central section 174 may include a plurality of segments or loops 175 extending helically about a central axis 'CA.' Although non-limiting, the central axis may generally extend perpendicular to the beamline axis. The central section 174 be made of hollow tubing with an approximately circular cross section. In some embodiments, the coil 119 is a copper tube defining an internal channel to permit a cooling fluid to flow therethrough. For example, internally flowing water within the coil 119 may help dissipate heat generated by current traveling along the conductive material of the coil 119.

Figure 7:
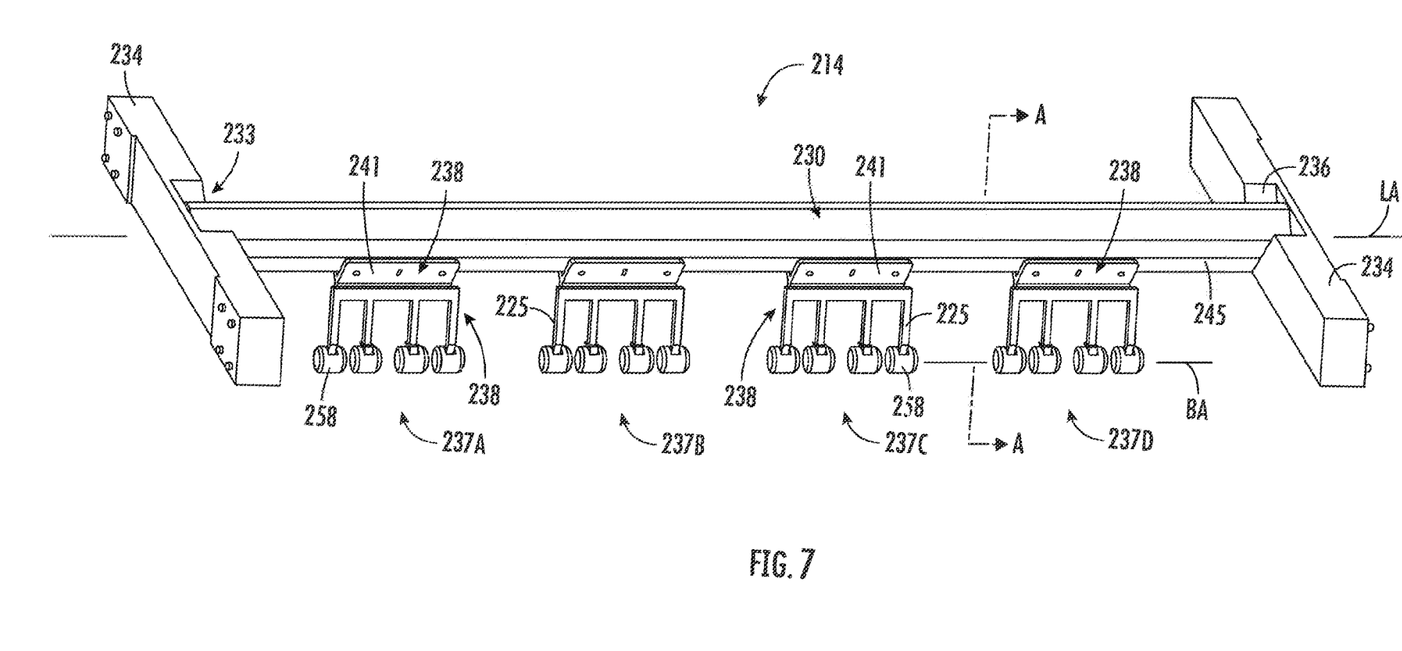
FIG. 7 is a perspective view of a portion of a modular linear accelerator assembly in accordance with embodiments of the present disclosure.
Figure 8:
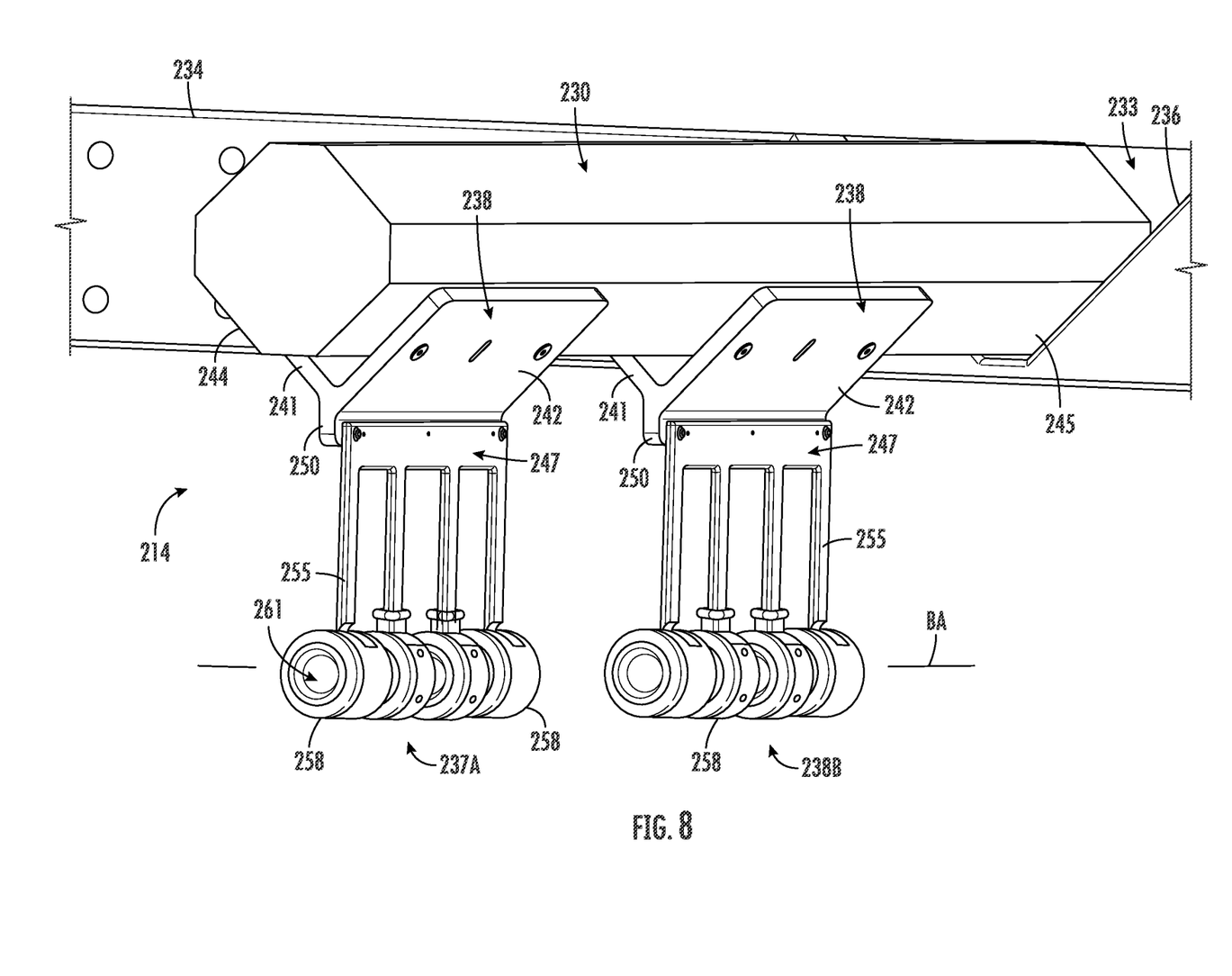
FIG. 8 is a perspective cross-sectional view of the modular linear accelerator assembly along cutline A-A of FIG. 7 in accordance with embodiments of the present disclosure.

Referring to FIGS. 7-8, portions of another linear accelerator assembly 214 according to embodiments of the present disclosure will be described. As shown, the linear accelerator assembly 214 may include a plurality of modules 237A-237D (e.g., resonator modules) be arranged along a lengthwise axis 'LA' of a central support 230, as desired. Each module 237A-237D may include one or more coils (not shown), similar to the coils 119 described herein. The central support 230 may be retained within a channel 233 of each of a set of side support structures 234, which may be coupled to an interior surface of a process chamber (not shown). An inner surface 236 defining the channel 233 may compliment an exterior surface shape of the central support 230 to provide a secure engagement between the set of side support structures 234 and the central support 230. Although not shown, the central support 230 may be coupled to the set of side support structures 234 by one or more fasteners or attachment mechanisms.

In some embodiments, each module 237A-237D is secured to the central support 230 by a resonator mounting block 238. As best shown in FIG. 8, each resonator mounting block 238 may include a first attachment element 241 engaged with a first surface 244 of the central support 230, and a second attachment element 242 engaged with a second surface 245 of the central support 230. Although non-limiting, the first and second attachment elements 241, 242 may be oriented perpendicular to one another. Each resonator mounting block 238 may include a ridge 250 at an intersection of the first attachment element 241 and the second attachment element 242, and a connector plate 247 extending from the ridge 250. As shown, the connector plate 247 may include a plurality of digits or members 255 extending away from the central support 230, and an electrode 258 connected to an end of each member 255. Each of the members 255 may be made from a non-conductive material. In some embodiments, each electrode 258 may be a cylinder defining an opening 261 for receiving/delivering the ion beam along a beamline axis 'BA'.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. However, it should be understood that various features of the certain aspects, embodiments, or configurations of the disclosure may be combined in alternate aspects, embodiments, or configurations.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other. Furthermore, identification references (e.g., primary, secondary, first, second, third, fourth, etc.) are not intended to connote importance or priority, but are used to distinguish one feature from another.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A linear accelerator assembly, comprising:
a central support within a chamber; and
a plurality of modules coupled to the central support, at least one module of the plurality of modules including an electrode having an aperture for receiving and delivering an ion beam along a beamline axis, wherein the at least one module of the plurality of modules is one of the following: a resonator module coupled to the central support by a resonator mounting block, or a quadrupole module coupled to the central support by a quad mounting block.

2. The linear accelerator assembly of claim 1, wherein a lengthwise axis of the central support is parallel to the beamline axis.

3. The linear accelerator assembly of claim 1, wherein the resonator mounting block comprises:
a main body directly coupled to a first surface of the central support;
a connector plate extending from the main body, the connector plate directly coupled to a second surface of the central support; and
an insulator plate coupled to the main body, wherein a coil of the resonator module extends through the insulator plate.

4. The linear accelerator assembly of claim 1, wherein the quadrupole module includes an opening to receive the ion beam.

5. The linear accelerator assembly of claim 1, wherein the at least one module of the plurality of modules comprises a connector plate including a plurality of members extending away from the central support, and wherein the electrode is connected to an end of one of the plurality of members.

6. The linear accelerator assembly of claim 5, wherein the connector plate is made from a non-conductive material, and wherein the plurality of members are oriented perpendicular to the beamline axis.

7. An ion implanter, comprising:
an ion source operable to generate an ion beam; and
a linear accelerator assembly operable to receive the ion beam, the linear accelerator assembly comprising:
a central support extending within an interior of a vacuum chamber; and
a plurality of modules coupled to the central support, at least one module of the plurality of modules including an electrode having an aperture for receiving and delivering the ion beam along a beamline axis, wherein the at least one module of the plurality of modules is one of the following: a resonator module coupled to the central support by a resonator mounting block, or a quadrupole module coupled to the central support by a quad mounting block.

8. The ion implanter of claim 7, wherein the quadrupole module includes an opening to receive the ion beam.

9. The ion implanter of claim 7, wherein the resonator mounting block comprises:
a main body directly coupled to a first surface of the central support;
a connector plate extending from the main body, the connector plate directly coupled to a second surface of the central support; and
an insulator plate coupled to the main body, wherein a coil of the resonator module extends through the insulator plate.

10. The ion implanter of claim 7, wherein the at least one module of the plurality of modules comprises a connector plate including a plurality of members extending away from the central support, wherein the electrode is connected to an end of one of the plurality of members, and wherein the connector plate is made from a non-conductive material.

11. A linear accelerator assembly of an ion implanter, the linear accelerator assembly comprising:
   a central support within a chamber, wherein the central support extends parallel to a beamline axis;
   a plurality of quadrupole modules and a plurality of resonator modules each coupled to the central support, wherein one or more resonator modules of the plurality of resonator modules includes an electrode having an aperture for receiving and delivering an ion beam along the beamline axis; and
   a quad mounting block coupling at least one quadrupole module of the plurality of quadrupole modules to the central support.

12. The linear accelerator assembly of claim 11, further comprising a resonator mounting block coupling each of the plurality of resonator modules to the central support, wherein the resonator mounting block comprises:
   a main body directly coupled to the central support;
   a connector plate extending perpendicularly from the main body, the connector plate coupled to the central support; and
   an insulator plate coupled to the main body, wherein a first coil section and a second coil section of one or more resonator modules of the plurality of resonator modules extend through the insulator plate.

13. The linear accelerator assembly of claim 12, the resonator mounting block further comprising a first support arm and a second support arm extending from the main body, wherein the insulator plate extends between the first and second support arms, wherein an inner surface of the main body is in direct contact with a first surface of the central support, and wherein an inner surface of the connector plate is in direct contact with a second surface of the central support.

14. The linear accelerator assembly of claim 11, at least one of the plurality of resonator modules comprising:
   an attachment element engaged with a surface of the central support; and
   a connector plate extending from the attachment element, the connector plate including a plurality of members extending away from the central support, wherein the electrode is connected to an end of one of the plurality of members, and wherein the plurality of members are oriented perpendicular to the beamline axis.

* * * * *